(12) United States Patent
Wang et al.

(10) Patent No.: US 11,500,960 B2
(45) Date of Patent: Nov. 15, 2022

(54) MEMORY CELL FOR DOT PRODUCT OPERATION IN COMPUTE-IN-MEMORY CHIP

(71) Applicant: QUALCOMM Incorporated, San Diego, CA (US)

(72) Inventors: Zhongze Wang, San Diego, CA (US); Ye Lu, San Diego, CA (US); Yandong Gao, San Diego, CA (US); Xiaochun Zhu, San Diego, CA (US); Xia Li, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 495 days.

(21) Appl. No.: 16/666,699

(22) Filed: Oct. 29, 2019

(65) Prior Publication Data

US 2021/0124793 A1    Apr. 29, 2021

(51) Int. Cl.
*G11C 11/419* (2006.01)
*G06F 17/16* (2006.01)
*G11C 11/412* (2006.01)
*G06N 3/063* (2006.01)

(52) U.S. Cl.
CPC ............. *G06F 17/16* (2013.01); *G06N 3/063* (2013.01); *G11C 11/412* (2013.01); *G11C 11/419* (2013.01)

(58) Field of Classification Search
CPC ...... G06F 17/16; G06N 3/063; G06N 3/0454; G11C 11/412; G11C 11/419; G11C 11/54; G11C 7/1006; G11C 7/16
See application file for complete search history.

(56) References Cited

U.S. PATENT DOCUMENTS

| 2019/0042199 | A1* | 2/2019  | Sumbul  | G11C 11/4091 |
| 2019/0080231 | A1* | 3/2019  | Nestler | G11C 8/16    |
| 2021/0271597 | A1* | 9/2021  | Verma   | G11C 11/4074 |
| 2021/0295905 | A1* | 9/2021  | Lee     | H03K 19/20   |
| 2021/0318852 | A1* | 10/2021 | Kim     | H03K 19/02   |

OTHER PUBLICATIONS

Jia H., et al., "A Microprocessor implemented in 65nm CMOS with Configurable and Bit-scalable Accelerator for Programmable In-memory Computing," Nov. 9, 2018, 10 pages.
Valavi H., et al., "A Mixed-Signal Binarized Convolutional-Neural-Network Accelerator Integrating Dense Weight Storage and Multiplication for Reduced Data Movement," 2018, IEEE Symposium on VLSI Circuits, VLSI Circuits, 2 pages.

\* cited by examiner

*Primary Examiner* — Jerome Leboeuf
(74) *Attorney, Agent, or Firm* — Patterson+ Sheridan, L.L.P.

(57) ABSTRACT

Certain aspects provide a circuit for in-memory computation. The circuit generally includes an in-memory computation array having a plurality of computation circuits, each of the computation circuits being configured to perform a dot product computation. In certain aspects, each of the computation circuits includes a memory cell, a capacitive element, a precharge transistor coupled between an output of the memory cell and the capacitive element, and a read transistor coupled between a read bit line (RBL) and the capacitive element.

14 Claims, 12 Drawing Sheets

800

| PCWL | N1 | Vc |
|------|----|----|
| 0    | 0  | 0  |
| 0    | 1  | 0  |
| 1    | 0  | 0  |
| 1    | 1  | 1  |

*FIG. 8*

MEMORY CELL FOR DOT PRODUCT OPERATION IN COMPUTE-IN-MEMORY CHIP

FIELD OF THE DISCLOSURE

The present disclosure generally relates to artificial neural networks and, more particularly, to techniques and apparatus for performing in-memory computations.

DESCRIPTION OF RELATED ART

An artificial neural network, which may be composed of an interconnected group of artificial neurons (e.g., neuron models), is a computational device or represents a method performed by a computational device. These neural networks may be used for various applications and/or devices, such as Internet Protocol (IP) cameras, Internet of Things (IoT) devices, autonomous vehicles, and/or service robots.

Convolutional neural networks (CNNs) are a type of feed-forward artificial neural network. Convolutional neural networks may include collections of artificial neurons that each have a receptive field and that collectively tile an input space. Convolutional neural networks have numerous applications. In particular, CNNs have broadly been used in the area of pattern recognition and classification.

In layered neural network architectures, the output of a first layer of artificial neurons becomes an input to a second layer of artificial neurons, the output of a second layer of artificial neurons becomes an input to a third layer of artificial neurons, and so on. Convolutional neural networks may be trained to recognize a hierarchy of features. Computation in convolutional neural network architectures may be distributed over a population of processing nodes, which may be configured in one or more computational chains. These multi-layered architectures may be trained one layer at a time and may be fine-tuned using back propagation.

SUMMARY

Certain aspects of the present disclosure are directed to methods and apparatus for in-memory convolution computation.

Certain aspects provide a circuit for in-memory computation. The circuit generally includes an in-memory computation array having a plurality of computation circuits, each of the computation circuits being configured to perform a dot product computation. In certain aspects, each of the computation circuits includes a memory cell, a capacitive element, a precharge transistor coupled between an output of the memory cell and the capacitive element, and a read transistor coupled between a read bit line (RBL) and the capacitive element.

Certain aspects provide a circuit for in-memory computation. The circuit generally includes a computation circuit configured to perform a dot product computation and having a memory cell, a capacitive element, a precharge transistor coupled between an output of the memory cell and the capacitive element, and a read transistor coupled between a RBL and the capacitive element.

Certain aspects provide a method for in-memory computation. The method generally includes selectively coupling, via a precharge transistor, an output of a memory cell to a capacitive element during a precharge phase, and selectively coupling, via a read transistor, the capacitive element to a RBL during a read phase, wherein a voltage across the capacitive element after the precharge phase represents an output of dot product computation.

Other aspects, advantages, and features of the present disclosure will become apparent after review of the entire application, including the following sections: Brief Description of the Drawings, Detailed Description, and the Claims.

BRIEF DESCRIPTION OF THE DRAWINGS

FIG. 8 is an example truth table illustrating a dot product operation performed by a computation system, in accordance with certain aspects of the present disclosure.

DETAILED DESCRIPTION

Certain aspects of the present disclosure provide methods and apparatus for in-memory computations.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Example Artificial Neural Networks

Figure 1:
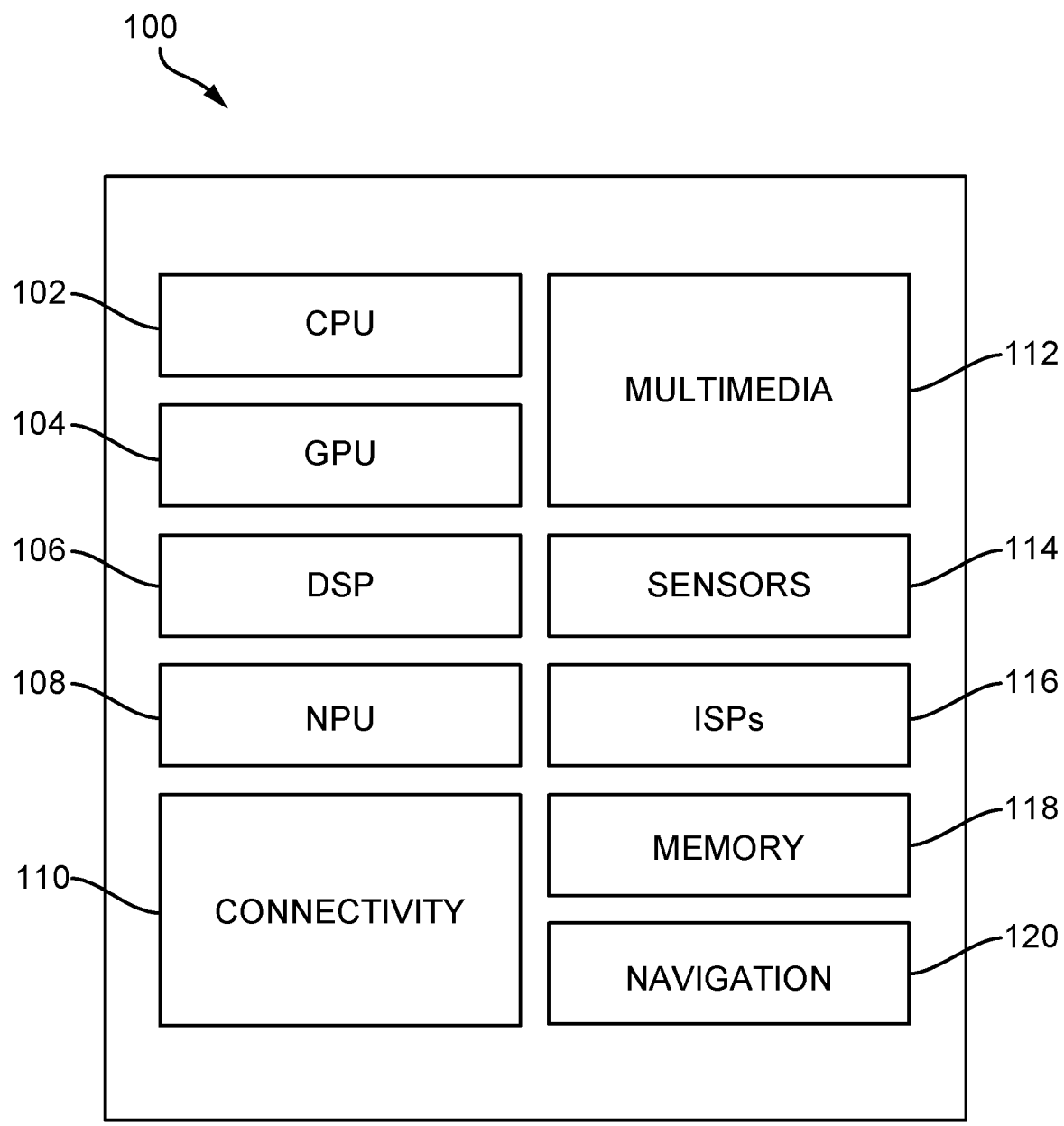
FIG. 1 illustrates an example implementation of a system-on-a-chip (SOC).

FIG. 1 illustrates an example implementation of a system-on-a-chip (SOC) 100, which may include a central processing unit (CPU) 102 or a multi-core CPU configured to perform a parallel Monte Carlo dropout function, in accordance with certain aspects of the present disclosure. Variables (e.g., neural signals and synaptic weights), system parameters associated with a computational device (e.g., neural network with weights), delays, frequency bin information, and task information may be stored in a memory block associated with a neural processing unit (NPU) 108, in a memory block associated with a CPU 102, in a memory block associated with a graphics processing unit (GPU) 104, in a memory block associated with a digital signal processor (DSP) 106, in a memory block 118, or may be distributed across multiple blocks. In certain aspects, weights may be stored in a static random-access memory (SRAM) configured to in-memory computations, as described in more detail herein. Instructions executed at the CPU 102 may be loaded from a program memory associated with the CPU 102 or may be loaded from a memory block 118.

The SOC 100 may also include additional processing blocks tailored to specific functions, such as a GPU 104, a DSP 106, a connectivity block 110, which may include fifth generation (5G) connectivity, fourth generation long term evolution (4G LTE) connectivity, Wi-Fi connectivity, USB connectivity, Bluetooth connectivity, and the like, and a multimedia processor 112 that may, for example, detect and recognize gestures. In one implementation, the NPU is implemented in the CPU, DSP, and/or GPU. The SOC 100 may also include a sensor processor 114, image signal processors (ISPs) 116, and/or navigation module 120, which may include a global positioning system.

The SOC 100 may be based on an ARM instruction set. In an aspect of the present disclosure, the instructions loaded into the CPU 102 may comprise code to search for a stored multiplication result in a lookup table (LUT) corresponding to a multiplication product of an input feature value and a filter weight. The instructions loaded into the CPU 102 may also comprise code to disable a multiplier during a multiplication operation of the multiplication product when a lookup table hit of the multiplication product is detected. In addition, the instructions loaded into the CPU 102 may comprise code to store a computed multiplication product of the input feature and the filter weight when a lookup table miss of the multiplication product is detected.

SOC 100 and/or components thereof may be configured to perform video compression and/or decompression according to aspects of the present disclosure discussed below. By using deep learning architectures to perform video compression and/or decompression, aspects of the present disclosure may accelerate the compression of video content on a device and transmission of the compressed video to another device and/or may accelerate the decompression of compressed video content received at the device.

Deep learning architectures may perform an object recognition task by learning to represent inputs at successively higher levels of abstraction in each layer, thereby building up a useful feature representation of the input data. In this way, deep learning addresses a major bottleneck of traditional machine learning. Prior to the advent of deep learning, a machine learning approach to an object recognition problem may have relied heavily on human engineered features, perhaps in combination with a shallow classifier. A shallow classifier may be a two-class linear classifier, for example, in which a weighted sum of the feature vector components may be compared with a threshold to predict to which class the input belongs. Human engineered features may be templates or kernels tailored to a specific problem domain by engineers with domain expertise. Deep learning architectures, in contrast, may learn to represent features that are similar to what a human engineer might design, but through training. Furthermore, a deep network may learn to represent and recognize new types of features that a human might not have considered.

A deep learning architecture may learn a hierarchy of features. If presented with visual data, for example, the first layer may learn to recognize relatively simple features, such as edges, in the input stream. In another example, if presented with auditory data, the first layer may learn to recognize spectral power in specific frequencies. The second layer, taking the output of the first layer as input, may learn to recognize combinations of features, such as simple shapes for visual data or combinations of sounds for auditory data. For instance, higher layers may learn to represent complex shapes in visual data or words in auditory data. Still higher layers may learn to recognize common visual objects or spoken phrases.

Deep learning architectures may perform especially well when applied to problems that have a natural hierarchical structure. For example, the classification of motorized vehicles may benefit from first learning to recognize wheels, windshields, and other features. These features may be combined at higher layers in different ways to recognize cars, trucks, and airplanes.

Neural networks may be designed with a variety of connectivity patterns. In feed-forward networks, information is passed from lower to higher layers, with each neuron in a given layer communicating to neurons in higher layers. A hierarchical representation may be built up in successive layers of a feed-forward network, as described above. Neural networks may also have recurrent or feedback (also called top-down) connections. In a recurrent connection, the output from a neuron in a given layer may be communicated to another neuron in the same layer. A recurrent architecture may be helpful in recognizing patterns that span more than one of the input data chunks that are delivered to the neural network in a sequence. A connection from a neuron in a given layer to a neuron in a lower layer is called a feedback (or top-down) connection. A network with many feedback connections may be helpful when the recognition of a high-level concept may aid in discriminating the particular low-level features of an input.

Figure 2A:
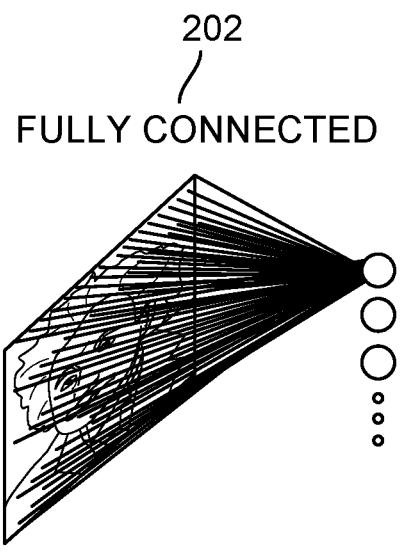
FIG. 2A illustrates an example of a fully connected neural network.
Figure 2B:
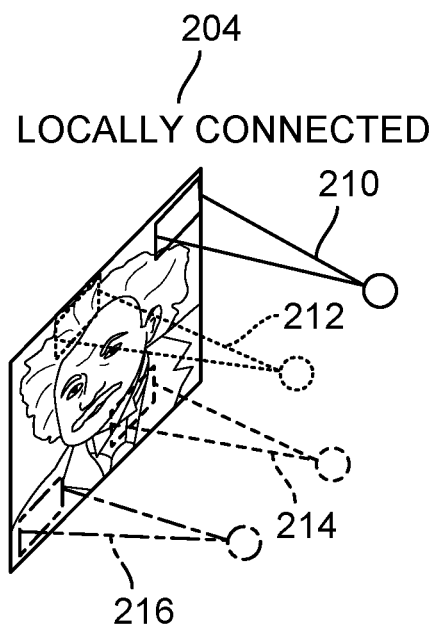
FIG. 2B illustrates an example of a locally connected neural network.

The connections between layers of a neural network may be fully connected or locally connected. FIG. 2A illustrates an example of a fully connected neural network 202. In a fully connected neural network 202, a neuron in a first layer may communicate its output to every neuron in a second layer, so that each neuron in the second layer will receive input from every neuron in the first layer. FIG. 2B illustrates an example of a locally connected neural network 204. In a locally connected neural network 204, a neuron in a first layer may be connected to a limited number of neurons in the second layer. More generally, a locally connected layer of the locally connected neural network 204 may be configured so that each neuron in a layer will have the same or a similar connectivity pattern, but with connections strengths that may have different values (e.g., 210, 212, 214, and 216). The locally connected connectivity pattern may give rise to spatially distinct receptive fields in a higher layer, because the higher layer neurons in a given region may receive inputs that are tuned through training to the properties of a restricted portion of the total input to the network.

Figure 2C:
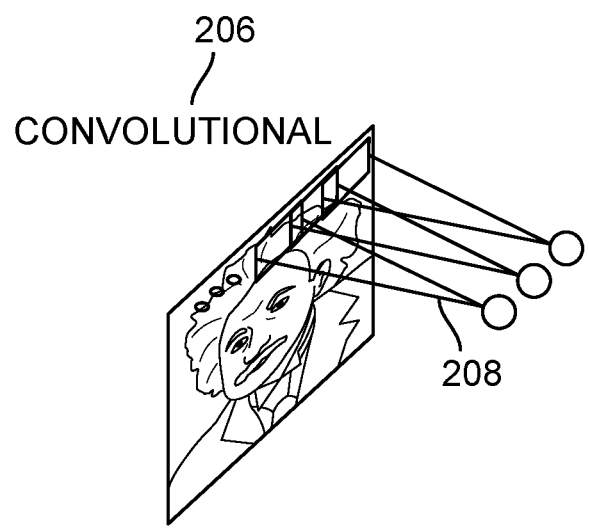
FIG. 2C illustrates an example of a convolutional neural network.

One example of a locally connected neural network is a convolutional neural network. FIG. 2C illustrates an example of a convolutional neural network 206. The convolutional neural network 206 may be configured such that the connection strengths associated with the inputs for each neuron in the second layer are shared (e.g., 208). Convolutional neural networks may be well suited to problems in which the spatial location of inputs is meaningful. Convolutional neural network 206 may be used to perform one or more aspects of video compression and/or decompression, according to aspects of the present disclosure.

Figure 2D:
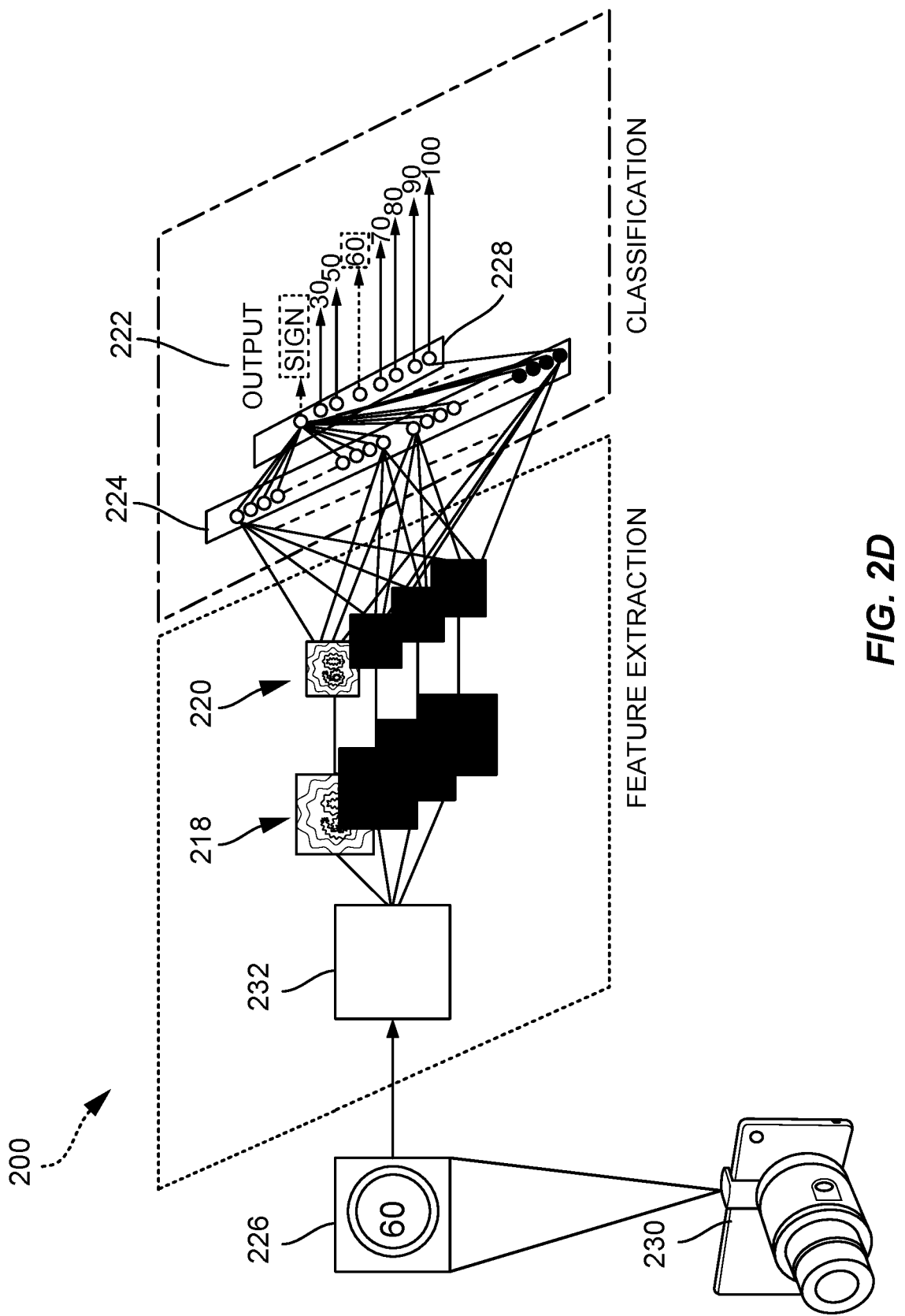
FIG. 2D illustrates a detailed example of a deep convolutional network (DCN) designed to recognize visual features from an image.

One type of convolutional neural network is a deep convolutional network (DCN). FIG. 2D illustrates a detailed example of a DCN 200 designed to recognize visual features from an image 226 input from an image capturing device 230, such as a car-mounted camera. The DCN 200 of the current example may be trained to identify traffic signs and a number provided on the traffic sign. Of course, the DCN 200 may be trained for other tasks, such as identifying lane markings or identifying traffic lights.

The DCN 200 may be trained with supervised learning. During training, the DCN 200 may be presented with an image, such as the image 226 of a speed limit sign, and a forward pass may then be computed to produce an output 222. The DCN 200 may include a feature extraction section and a classification section. Upon receiving the image 226, a convolutional layer 232 may apply convolutional kernels (not shown) to the image 226 to generate a first set of feature maps 218. As an example, the convolutional kernel for the convolutional layer 232 may be a 5×5 kernel that generates 28×28 feature maps. In the present example, because four different feature maps are generated in the first set of feature maps 218, four different convolutional kernels were applied to the image 226 at the convolutional layer 232. The convolutional kernels may also be referred to as filters or convolutional filters.

The first set of feature maps 218 may be subsampled by a max pooling layer (not shown) to generate a second set of feature maps 220. The max pooling layer reduces the size of the first set of feature maps 218. That is, a size of the second set of feature maps 220, such as 14×14, is less than the size of the first set of feature maps 218, such as 28×28. The reduced size provides similar information to a subsequent layer while reducing memory consumption. The second set of feature maps 220 may be further convolved via one or more subsequent convolutional layers (not shown) to generate one or more subsequent sets of feature maps (not shown).

In the example of FIG. 2D, the second set of feature maps 220 is convolved to generate a first feature vector 224. Furthermore, the first feature vector 224 is further convolved to generate a second feature vector 228. Each feature of the second feature vector 228 may include a number that corresponds to a possible feature of the image 226, such as "sign," "60," and "100." A softmax function (not shown) may convert the numbers in the second feature vector 228 to a probability. As such, an output 222 of the DCN 200 is a probability of the image 226 including one or more features.

In the present example, the probabilities in the output 222 for "sign" and "60" are higher than the probabilities of the others of the output 222, such as "30," "40," "50," "70," "80," "90," and "100." Before training, the output 222 produced by the DCN 200 is likely to be incorrect. Thus, an error may be calculated between the output 222 and a target output. The target output is the ground truth of the image 226 (e.g., "sign" and "60"). The weights of the DCN 200 may then be adjusted so the output 222 of the DCN 200 is more closely aligned with the target output. In certain aspects, the weights of the DCN 200 may be stored in an SRAM configured for in-memory computations, as described in more detail herein.

To adjust the weights, a learning algorithm may compute a gradient vector for the weights. The gradient may indicate an amount that an error would increase or decrease if the weight were adjusted. At the top layer, the gradient may correspond directly to the value of a weight connecting an activated neuron in the penultimate layer and a neuron in the output layer. In lower layers, the gradient may depend on the value of the weights and on the computed error gradients of the higher layers. The weights may then be adjusted to reduce the error. This manner of adjusting the weights may be referred to as "back propagation" as it involves a "backward pass" through the neural network.

In practice, the error gradient of weights may be calculated over a small number of examples, so that the calculated gradient approximates the true error gradient. This approximation method may be referred to as stochastic gradient descent. Stochastic gradient descent may be repeated until the achievable error rate of the entire system has stopped decreasing or until the error rate has reached a target level. After learning, the DCN may be presented with new images (e.g., the speed limit sign of the image 226) and a forward pass through the network may yield an output 222 that may be considered an inference or a prediction of the DCN.

Deep belief networks (DBNs) are probabilistic models comprising multiple layers of hidden nodes. DBNs may be used to extract a hierarchical representation of training data sets. A DBN may be obtained by stacking up layers of Restricted Boltzmann Machines (RBMs). An RBM is a type of artificial neural network that can learn a probability distribution over a set of inputs. Because RBMs can learn a probability distribution in the absence of information about the class to which each input should be categorized, RBMs are often used in unsupervised learning. Using a hybrid unsupervised and supervised paradigm, the bottom RBMs of a DBN may be trained in an unsupervised manner and may serve as feature extractors, and the top RBM may be trained in a supervised manner (on a joint distribution of inputs from the previous layer and target classes) and may serve as a classifier.

Deep convolutional networks (DCNs) are networks of convolutional networks, configured with additional pooling and normalization layers. DCNs have achieved state-of-the-art performance on many tasks. DCNs can be trained using supervised learning in which both the input and output targets are known for many exemplars and are used to modify the weights of the network by use of gradient descent methods.

DCNs may be feed-forward networks. In addition, as described above, the connections from a neuron in a first layer of a DCN to a group of neurons in the next higher layer are shared across the neurons in the first layer. The feed-forward and shared connections of DCNs may be exploited for fast processing. The computational burden of a DCN may be much less, for example, than that of a similarly sized neural network that comprises recurrent or feedback connections.

The processing of each layer of a convolutional network may be considered a spatially invariant template or basis projection. If the input is first decomposed into multiple channels, such as the red, green, and blue channels of a color image, then the convolutional network trained on that input may be considered three-dimensional, with two spatial dimensions along the axes of the image and a third dimension capturing color information. The outputs of the convolutional connections may be considered to form a feature map in the subsequent layer, with each element of the feature map (e.g., 220) receiving input from a range of neurons in the previous layer (e.g., feature maps 218) and from each of the multiple channels. The values in the feature map may be further processed with a non-linearity, such as a rectification, max(0,x). Values from adjacent neurons may be further pooled, which corresponds to down sampling, and may provide additional local invariance and dimensionality reduction. Normalization, which corresponds to whitening, may also be applied through lateral inhibition between neurons in the feature map.

The performance of deep learning architectures may increase as more labeled data points become available or as computational power increases. Modern deep neural networks are routinely trained with computing resources that are thousands of times greater than what was available to a typical researcher just fifteen years ago. New architectures and training paradigms may further boost the performance of deep learning. Rectified linear units may reduce a training issue known as vanishing gradients. New training techniques may reduce over-fitting and thus enable larger models to achieve better generalization. Encapsulation techniques may abstract data in a given receptive field and further boost overall performance.

Figure 3:
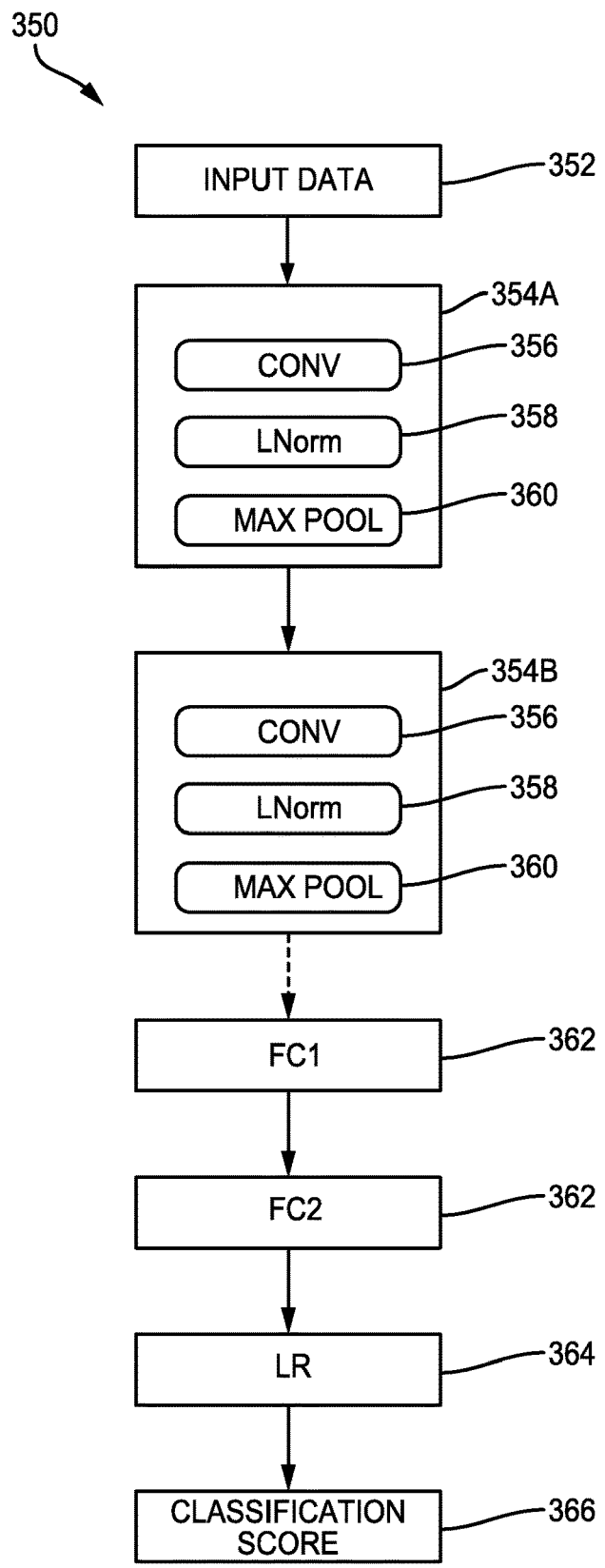
FIG. 3 is a block diagram illustrating a DCN.

FIG. 3 is a block diagram illustrating a deep convolutional network 350. The deep convolutional network 350 may include multiple different types of layers based on connectivity and weight sharing. As shown in FIG. 3E, the deep convolutional network 350 includes the convolution blocks 354A, 354B. Each of the convolution blocks 354A, 354B may be configured with a convolution layer (CONV) 356, a normalization layer (LNorm) 358, and a max pooling layer (MAX POOL) 360. Deep convolutional network 350 may be used to perform video compression and/or decompression, according to aspects of the present disclosure.

The convolution layers 356 may include one or more convolutional filters, which may be applied to the input data to generate a feature map. Although only two of the convolution blocks 354A, 354B are shown, the present disclosure is not so limiting, and instead, any number of the convolution blocks 354A, 354B may be included in the deep convolutional network 350 according to design preference. The normalization layer 358 may normalize the output of the convolution filters. For example, the normalization layer 358 may provide whitening or lateral inhibition. The max pooling layer 360 may provide down sampling aggregation over space for local invariance and dimensionality reduction.

The parallel filter banks, for example, of a deep convolutional network may be loaded on a CPU 102 or GPU 104 of an SOC 100 to achieve high performance and low power consumption. In alternative aspects, the parallel filter banks may be loaded on the DSP 106 or an ISP 116 of an SOC 100. In addition, the deep convolutional network 350 may access other processing blocks that may be present on the SOC 100, such as sensor processor 114 and navigation module 120, dedicated, respectively, to sensors and navigation.

The deep convolutional network 350 may also include one or more fully connected layers 362 (FC1 and FC2). The deep convolutional network 350 may further include a logistic regression (LR) layer 364. Between each layer 356, 358, 360, 362, 364 of the deep convolutional network 350 are weights (not shown) that are to be updated. In certain aspects, the weights may be stored in an SRAM configured for in-memory computations, as described in more detail herein. The output of each of the layers (e.g., 356, 358, 360, 362, 364) may serve as an input of a succeeding one of the layers (e.g., 356, 358, 360, 362, 364) in the deep convolutional network 350 to learn hierarchical feature representations from input data 352 (e.g., images, audio, video, sensor data and/or other input data) supplied at the first of the convolution blocks 354A. The output of the deep convolutional network 350 is a classification score 366 for the input data 352. The classification score 366 may be a set of probabilities, where each probability is the probability of the input data including a feature from a set of features.

Example Memory Cell for Dot Product Operation in Compute-in-Memory Chip

In binary neural networks, weights and neuron activations are binarized. A convolutional neural network (CNN) with binary weights may be implemented with a smaller footprint than an equivalent network implemented with multi-bit (e.g., 16 bits) weights. Binary-weight approximations of large CNNs may be implemented with a smaller amount of memory storage, and thus, may be implemented in small portable devices while maintaining the same level of accuracy as multi-bit networks. Binary network computations may be performed by enabling binary convolutions within a static random access memory (SRAM) array. Compute-in-memory (CIM) is a technique for performing logical operations for CNN in power constrained edge devices, such as mobile phones. In some cases, CIM may be implemented using a current-summation technique. However, the current-summation technique for CIM has relatively high power consumption and has low linearity. Certain aspects of the present disclosure are generally directed to a charge-sharing technique for CIM, having a lower power consumption and area, as compared to conventional implementations.

Figure 4A:
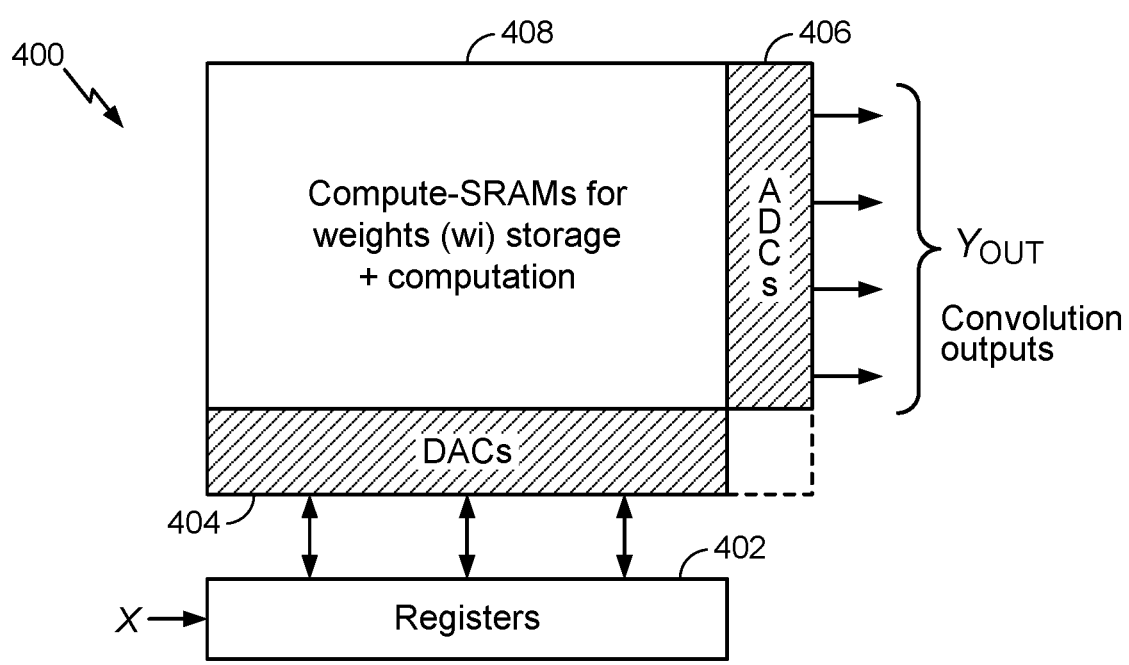
FIG. 4A illustrates an example computation system having a computation array implemented for in-memory convolution computation, in accordance with certain aspects of the present disclosure.

FIG. 4A illustrates an example computation system 400 having a computation array 408 implemented for in-memory convolution computation, in accordance with certain aspects of the present disclosure. The computation array 408 may include an array of SRAM memory cells, each coupled to computation circuitry, as described in more detail herein. Weight parameters may be stored in the SRAM memory cells of the computation array 408. As illustrated, input data, labeled "X" in FIG. 4A, may be input to registers 402. The input data may be provided to the computation circuitry via digital-to-analog converters (DACs) 404. The computation array 408 may perform in-memory convolution computation based on the input data and as a function of weights ($w_i$) stored in the SRAM memory cells. The output of the computation may be input to analog-to-digital converters (ADCs) 406, which provide output digital convolution outputs, labeled in FIG. 4A as "$Y_{OUT}$." Certain aspects of the present disclosure are directed to circuitry for performing in-memory computation using charge sharing.

Figure 4B:
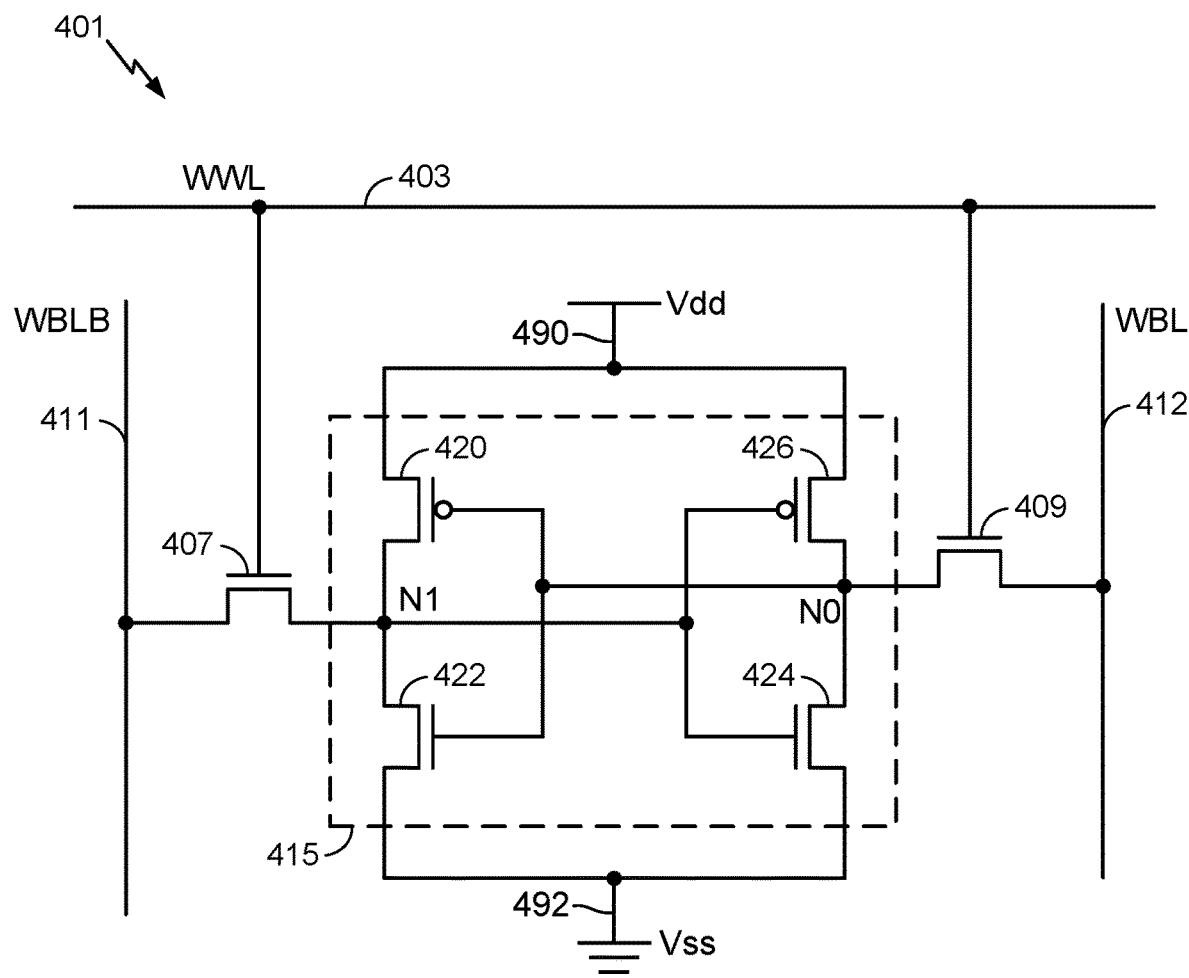
FIG. 4B illustrates an example memory cell of a static random access memory (SRAM), in accordance with certain aspects of the present disclosure.

FIG. 4B illustrates a memory cell 401 of a static random access memory (SRAM), in accordance with certain aspects of the present disclosure. As illustrated, the memory cell 401 may be coupled to a write word line (WWL) 403 of the SRAM. The WWL 403 is coupled to a control input of a pass gate (PG) transistor 407 for selectively coupling a write complementary bit line (WBLB) 411 of the SRAM to node N1 (also referred to as a complementary output node) of a flip-flop (FF) 415, and is coupled to a control input of a PG transistor 409 for selectively coupling a write bit line (WBL) 412 to node NO (also referred to as an output node) of the FF 415.

As illustrated, the FF 415 is coupled between a voltage rail (Vdd) node 490 and a reference potential node 492 (e.g., electric ground or Vss). The FF 415 includes a pull-up (PU) transistor 420 (e.g., a p-type metal-oxide-semiconductor (PMOS) transistor) having a drain coupled to a drain of a pull-down (PD) transistor 422 (e.g., an n-type metal-oxide-semiconductor (NMOS) transistor), forming part of node N1. The FF 415 also includes a PU transistor 426 having a drain coupled to a drain of a PD transistor 424, forming part of node NO. The gates of the PU transistor 420 and the PD transistor 422 are coupled to the node NO, and the gates of the PU transistor 426 and the PD transistor 424 are coupled to the node N1, as illustrated. The nodes N0 and N1 represent the output and complementary output nodes of the FF 415, respectively.

Figure 5:
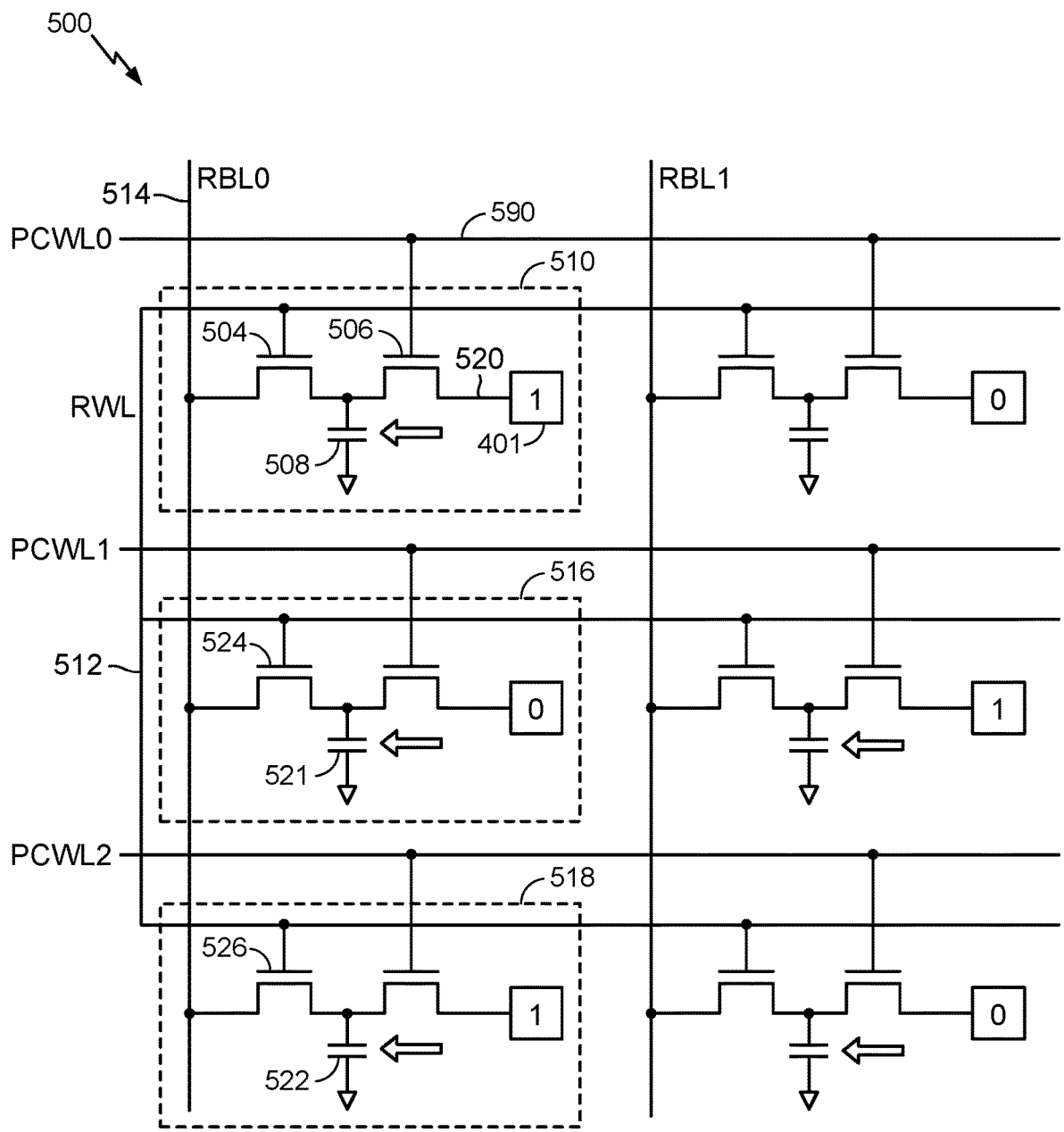
FIG. 5 illustrates a computation system for performing a dot product operation, in accordance with certain aspects of the present disclosure.

FIG. 5 illustrates a computation system 500 for performing a dot product operation, in accordance with certain aspects of the present disclosure. As illustrated, the computation system 500 includes an array of computation circuits (e.g., computation circuit 510), each including a memory cell (e.g., memory cell 401), two transistors (e.g., transistors 504, 506), and a capacitive element (e.g., capacitive element 508) coupled to a node between the two transistors. More specifically, one terminal of the capacitive element may be coupled to the node between the two transistors, and the other terminal of the capacitive element may be coupled to a reference potential node (e.g., electrical ground) for the computation circuit.

Each of the computation circuits of the computation system 500 may perform a dot product operation of an input digital signal which may be provided to the precharge word line (PCWL) (e.g., PCWL0 590) and a bit stored in the corresponding memory cell (e.g., memory cell 401). For example, during a precharge phase, the transistor 506 is on (e.g., in a conductive state) if the PCWL0 590 is at a logic high state. The capacitive element 508 may be charged depending on the signal at the output 520 of the memory cell 401. For example, if a logic high is stored in the memory cell 401 and the signal at PCWL0 590 is at a logic high state, the capacitive element 508 is charged during the precharge phase.

During a read phase, the transistor 506 is off (e.g., in a non-conductive state), and the transistor 504 is on (e.g., in a conductive state) via a signal on the read word line (RWL) 512, coupling the capacitive element 508 to the read bit line (RBL) (e.g., RBL0 514). As illustrated, the capacitive elements 521, 522 of computation circuits 516, 518 are also coupled to RBL0 514 during the read phase via respective transistors 524, 526. Thus, during the read phase, the charges of the capacitive elements 508, 521, 522 are shared, setting the voltage of RBL0 514. The voltage of RBL0 514 may be converted to a digital signal via one of the ADCs 406, to generate a computation output.

Figure 6A:
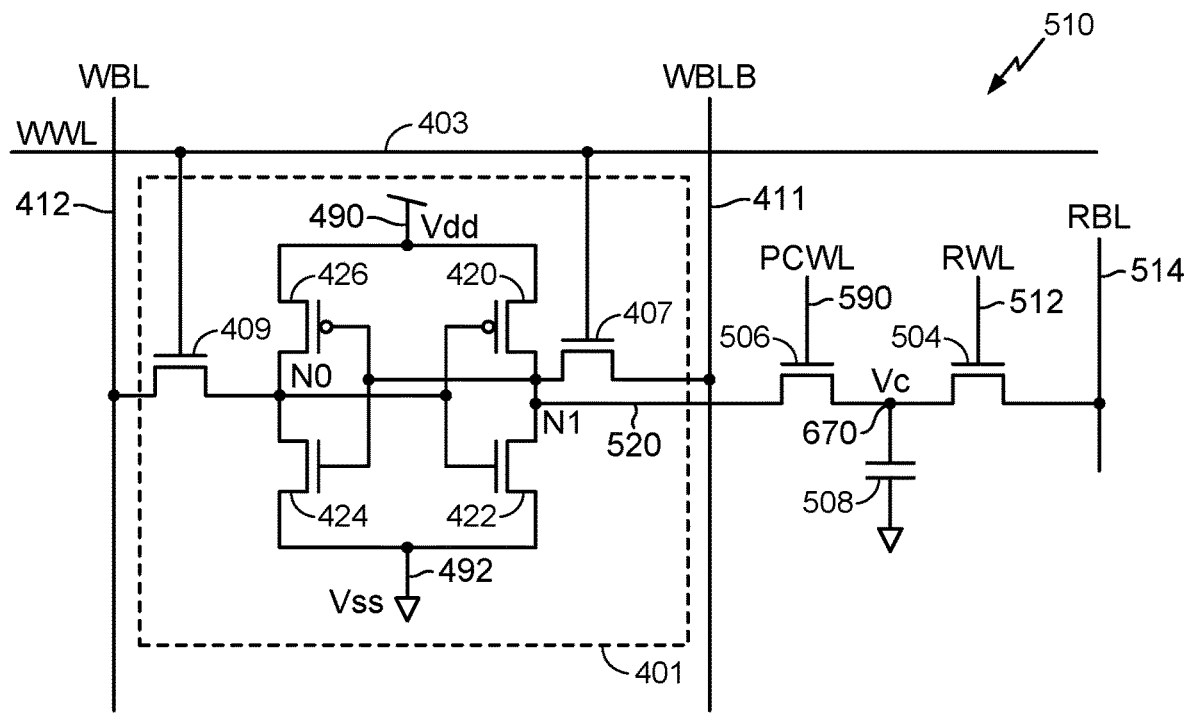
FIGS. 6A-6D illustrate various example implementations of a computation circuit in FIG. 5, in accordance with certain aspects of the present disclosure.
Figure 6B:
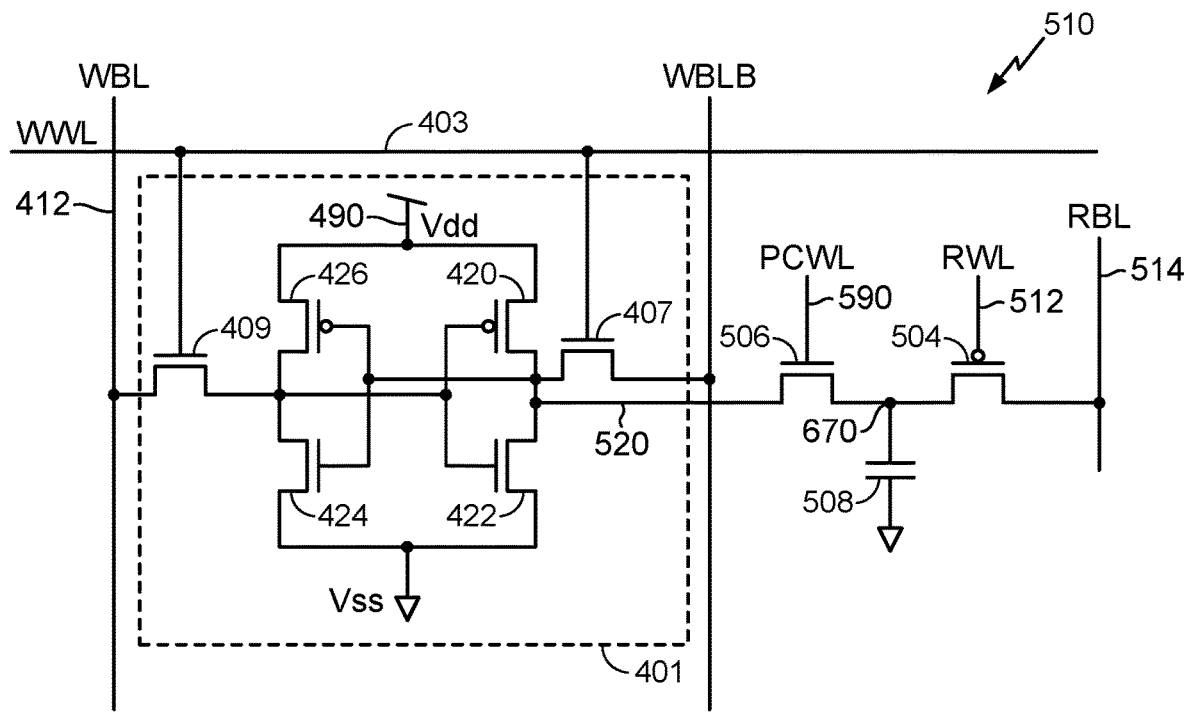
Figure 6C:
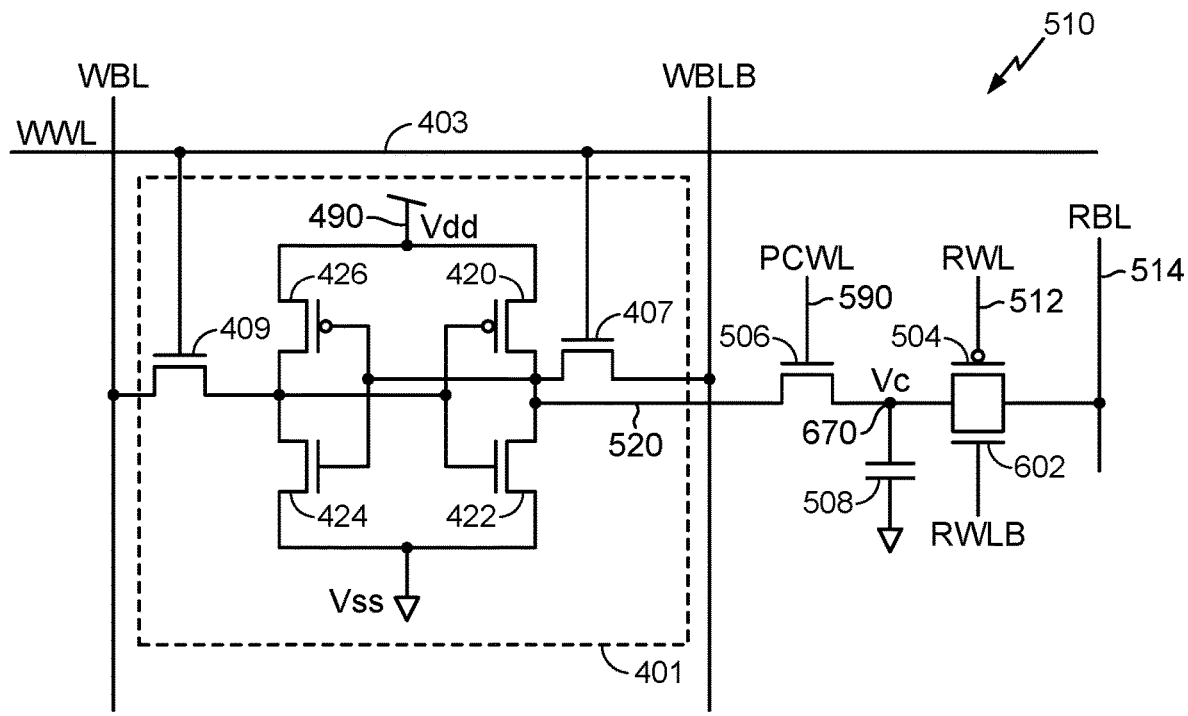
Figure 6D:
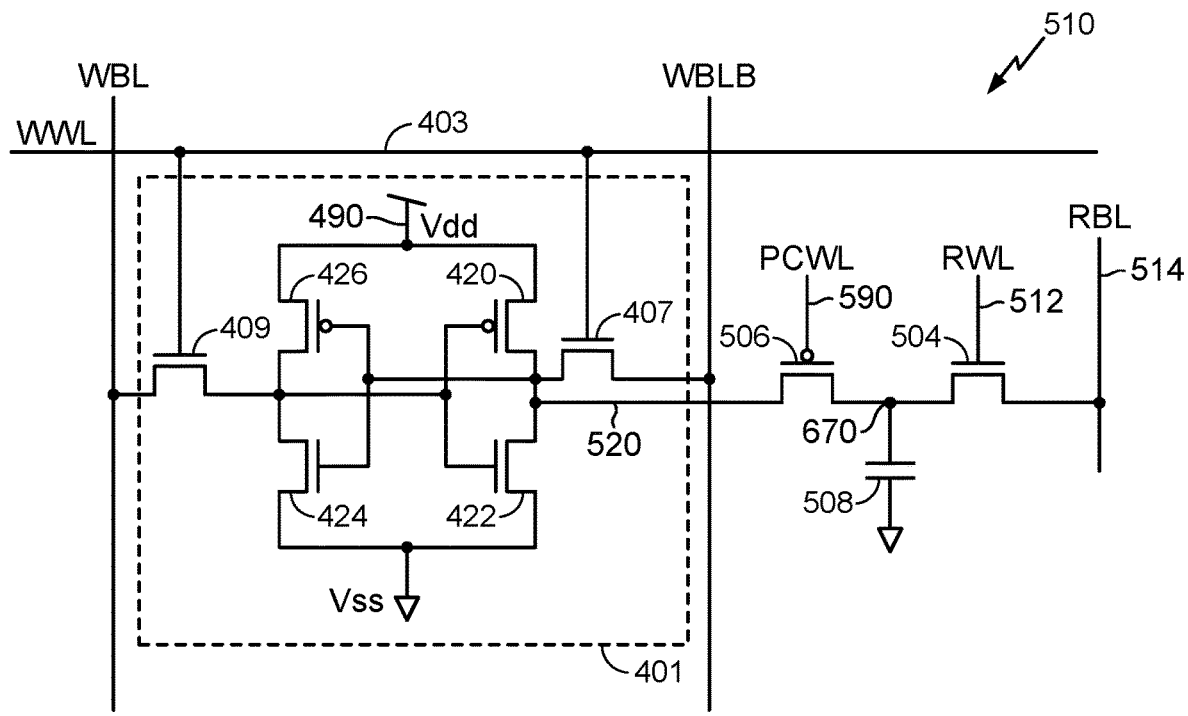

FIGS. 6A-6D illustrate various example implementations of the computation circuit 510, in accordance with certain aspects of the present disclosure. As illustrated, the memory cell 401 may be implemented as a static random-access memory (SRAM). As illustrated in FIG. 6A, the transistor 504 may be implemented as an n-type metal-oxide-semiconductor (NMOS) transistor. In certain aspects, as illustrated in FIG. 6B, the transistor 504 may be implemented as a p-type metal-oxide-semiconductor (PMOS) transistor. In certain aspects, as illustrated in FIG. 6C, the transistor 504 may be implemented as a PMOS transistor, and an NMOS transistor 602 may be coupled in parallel to the PMOS transistor, forming a transmission gate. For example, the drain of the transistor 504 may be coupled to the source of the NMOS transistor 602, and the source of the transistor 504 may be coupled to the drain of the NMOS transistor 602. The gates of transistors 504, 602 may be driven by complementary signals provided by the RWL and complementary read word line (RWLB), respectively. In certain aspects, as depicted in FIGS. 6A-6C, the transistor 506 may be implemented as an NMOS transistor. In other aspects, as illustrated in FIG. 6D, the transistor 506 may be implemented as a PMOS transistor. As illustrated, the terminal 670 of the capacitive element 508 is connected only to the precharge transistor 506 and the read transistor 504 (and also to the transistor 602 in FIG. 6C).

Figure 7:
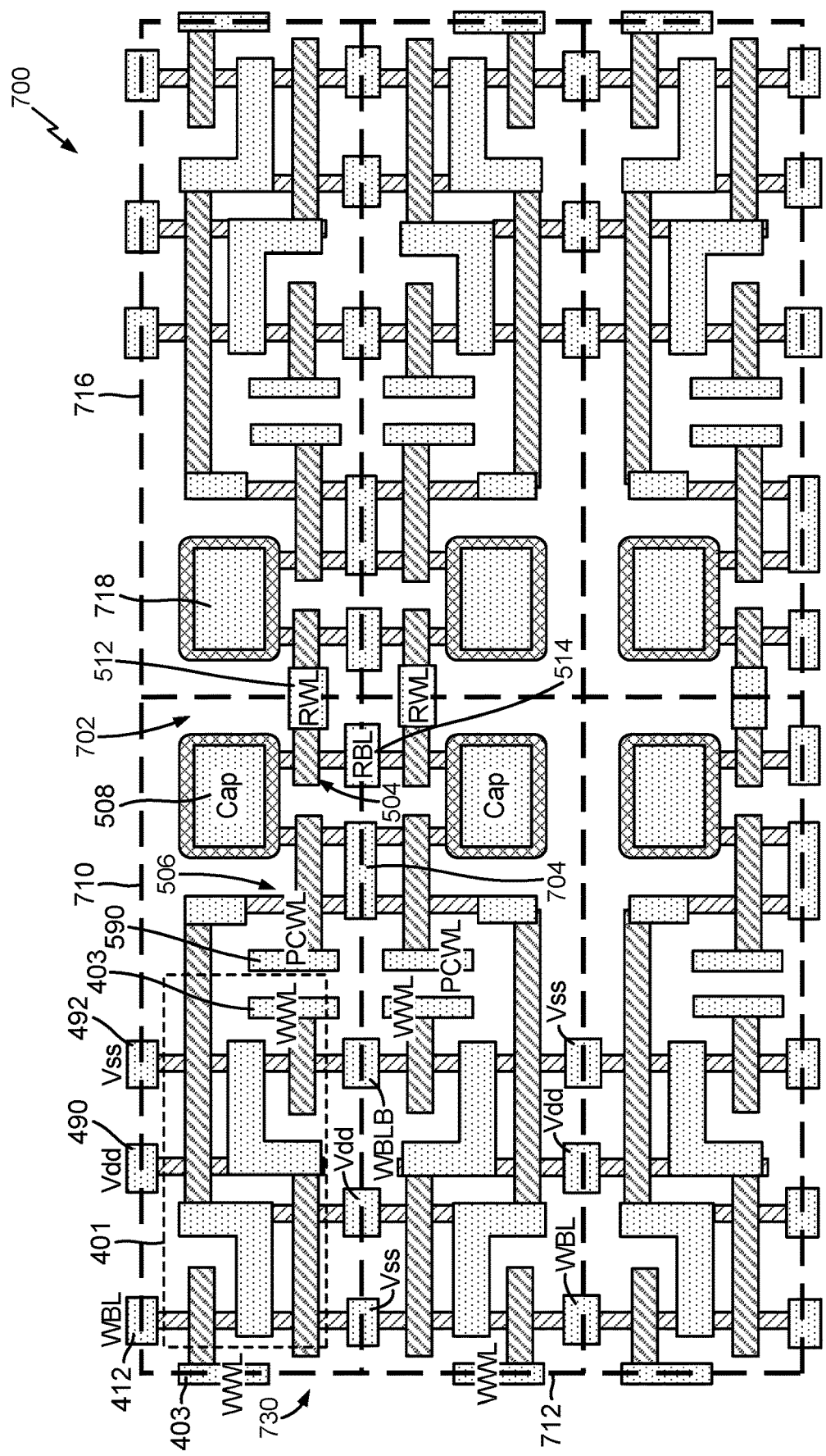
FIG. 7 illustrates an example layout of a computation system, in accordance with certain aspects of the present disclosure.

FIG. 7 illustrates an example layout of a computation system 700, in accordance with certain aspects of the present disclosure. FIG. 7 illustrates an array of six computation circuits of the computation system. As illustrated, the transistor 506, capacitive element 508, and the transistor 504 are implemented adjacent to the memory cell 401. As illustrated, a contact region 704 used to couple a terminal of the capacitive element 508 to the precharge transistor 506 is shared by two of the computation circuits 710, 712. The capacitive elements 508, 718 of the computation circuit 710 and the computation circuit 716, respectively, are disposed adjacent to the lateral side 702. Moreover, the contact region of the RWL 512 is shared by the computation circuit 710 and the computation circuit 716 at the lateral side 702. The memory cell 401 is adjacent to a side 730 of the layout of the computation circuit 710, the side 730 and the lateral side 702 being opposite sides of the layout of the computation circuit 510. As illustrated, the contact region for the RBL 514 is shared by computation circuits 710, 716.

Figure 8:
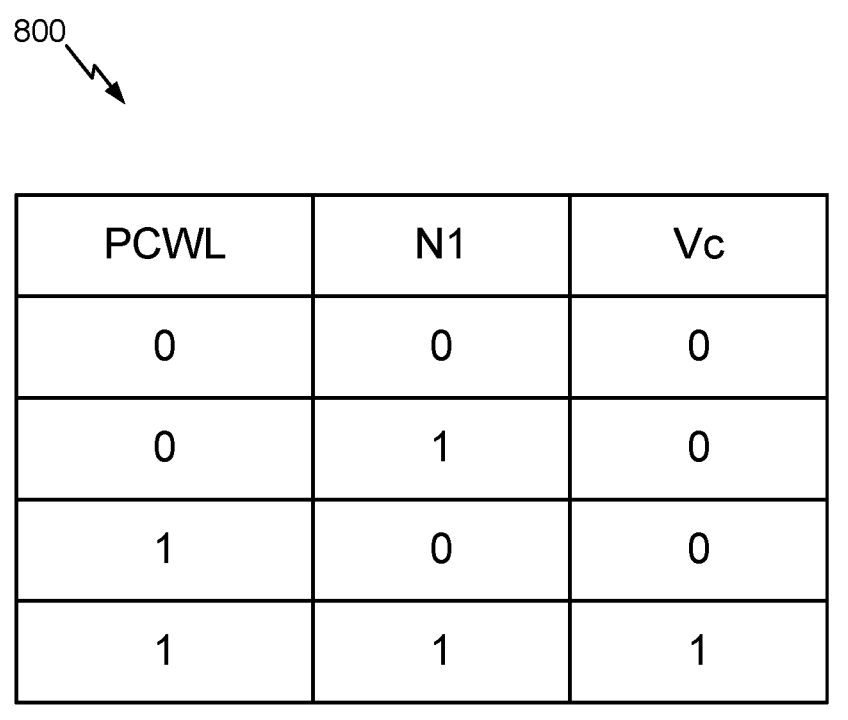

FIG. 8 is a truth table 800 illustrating a dot product operation performed by a computation circuit, in accordance with certain aspects of the present disclosure. As illustrated, the voltage Vc across the capacitive element 508 only represents a logic high when both the signal at the PCWL (e.g., PCWL0 590) and the output N1 of the memory cell are logic high.

Figure 9:
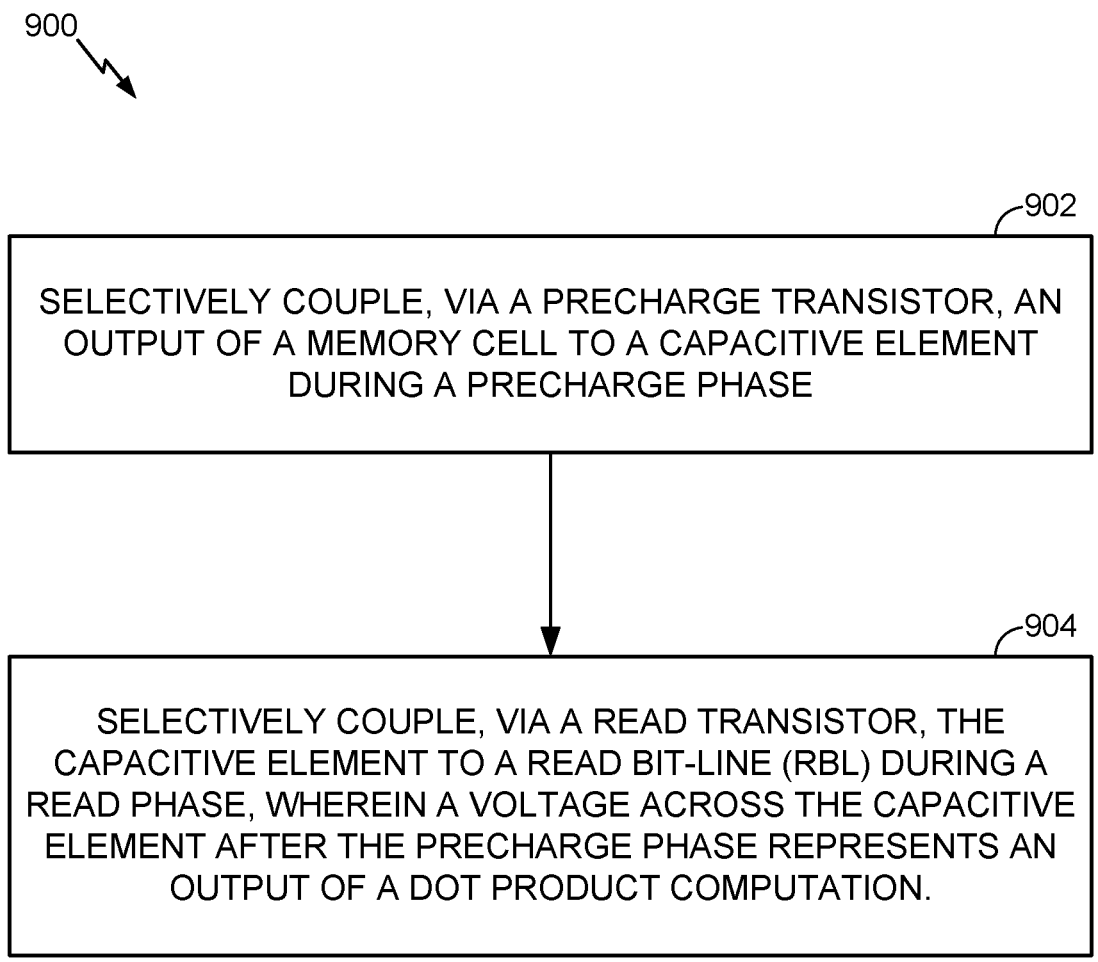
FIG. 9 is a flow diagram illustrating example operations for in-memory computation, in accordance with certain aspects of the present disclosure.

FIG. 9 is a flow diagram illustrating example operations 900 for in-memory computation, in accordance with certain aspects of the present disclosure. The operations 900 may be performed by a computation system, such as the computation system 500.

The operations 900 begin, at block 902, with the computation system selectively coupling (e.g., via a precharge transistor 506), an output of a memory cell (e.g., memory cell N1 output) to a capacitive element (e.g., capacitive element 508) during a precharge phase. At block 904, the computation system may selectively couple (e.g., via a read transistor 504) the capacitive element to a RBL (e.g., RBL0 514) during a read phase. In certain aspects, the voltage (e.g., voltage Vc) across the capacitive element after the precharge phase represents an output of dot product computation. A gate voltage of the precharge transistor may represent a first input computation parameter of the dot product computation and a signal at the output of the memory cell may represent a second input computation parameter of the dot product computation.

The various illustrative circuits described in connection with aspects described herein may be implemented in or with an integrated circuit (IC), such as a processor, a digital signal processor (DSP), an application-specific integrated circuit (ASIC), a field-programmable gate array (FPGA), or other programmable logic device. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is also noted that the operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A circuit for in-memory computation, comprising:
    an in-memory computation array having a plurality of computation circuits, each of the computation circuits being configured to perform a dot product computation and having:
    a memory cell;
    a capacitive element;
    a precharge transistor coupled between an output of the memory cell and the capacitive element, wherein a contact region used to couple a terminal of the capacitive element to the precharge transistor is shared by two of the computation circuits; and
    a read transistor coupled between a read bit line (RBL) and the capacitive element.

2. The circuit of claim 1, wherein:
    a first lateral side of a layout of a first computation circuit of the plurality of computation circuits is adjacent to a first lateral side of a second computation circuit of the plurality of computation circuits; and
    the capacitive elements of the first computation circuit and the second computation circuit are disposed adjacent to the first lateral sides of the first computation circuit and the second computation circuit, respectively.

3. The circuit of claim 2, wherein a gate of the read transistor is coupled to a read word line (RWL), a contact region for the RWL being shared by the first computation circuit and the second computation circuit at the first lateral side of the first computation circuit and the first lateral side of the second computation circuit.

4. The circuit of claim 2, wherein the memory cell of the first computation circuit is adjacent to a second lateral side of the layout of the first computation circuit, the first lateral side and the second lateral side of the first computation circuit being opposite sides of the layout of the first computation circuit.

5. The circuit of claim 1, wherein a contact region for the RBL is shared by two of the computation circuits.

6. The circuit of claim 1, further comprising a controller configured to:
    couple the output of the memory cell to the capacitive element by closing the precharge transistor during a precharge phase; and
    couple the capacitive element to the RBL by closing the read transistor during a read phase.

7. The circuit of claim 1, wherein the memory cell comprises a static random-access memory (SRAM) memory cell.

8. The circuit of claim 1, wherein the precharge transistor comprises a p-type metal-oxide-semiconductor (PMOS) transistor.

9. The circuit of claim 1, wherein the read transistor comprises a p-type metal-oxide-semiconductor (PMOS) transistor.

10. The circuit of claim 9, further comprising an n-type metal-oxide-semiconductor (NMOS) transistor having a drain coupled to a source of the PMOS transistor and a source coupled to a drain of the PMOS transistor.

11. A circuit for in-memory computation, comprising:
    a computation circuit configured to perform a dot product computation and having:
    a memory cell;
    a capacitive element;
    a precharge transistor coupled between an output of the memory cell and the capacitive element; and
    a read transistor coupled between a read bit line (RBL) and the capacitive element, wherein a terminal of the capacitive element is connected only to the precharge transistor and the read transistor.

12. The circuit of claim 11, further comprising a controller configured to:
    couple the output of the memory cell to the capacitive element by closing the precharge transistor during a precharge phase; and
    couple the capacitive element to the RBL by closing the read transistor during a read phase.

13. The circuit of claim 11, wherein the precharge transistor comprises a p-type metal-oxide-semiconductor (PMOS) transistor.

14. The circuit of claim 11, wherein the read transistor comprises a p-type metal-oxide-semiconductor (PMOS) transistor.

* * * * *